United States Patent [19]

Martlew et al.

[11] Patent Number: 4,995,340

[45] Date of Patent: Feb. 26, 1991

[54] GLASS COATING APPARATUS

[75] Inventors: David Martlew, Merseyside; Malcom J. Rigby, Lancashire, both of England

[73] Assignee: Pilkington PLC, Merseyside, England

[21] Appl. No.: 420,381

[22] Filed: Oct. 12, 1989

[30] Foreign Application Priority Data

Oct. 14, 1988 [GB] United Kingdom ............... 8824103

[51] Int. Cl.$^5$ .............................................. B05C 3/02
[52] U.S. Cl. ................................. 118/715; 65/59.23; 65/60.8; 65/157; 118/50
[58] Field of Search ................... 65/60.52, 18.2, 144, 65/157, 60.1, 60.8, 59.73; 118/715, 718, 728, 729, 50, 50.1

[56] References Cited

U.S. PATENT DOCUMENTS

| Re. 29,714 | 8/1978 | Hayner et al. ................ 138/42 |
| 3,191,630 | 6/1965 | Demyan ........................ 138/42 |
| 3,351,450 | 11/1967 | Silverwood .................. 65/157 |
| 3,517,643 | 6/1970 | Goldstein et al. ............ 118/715 |
| 3,755,684 | 8/1973 | Plumat et al. ................ 65/157 |
| 4,048,953 | 9/1977 | Froberg ........................ 118/718 |
| 4,325,986 | 4/1982 | Baron et al. ................. 118/718 |
| 4,363,647 | 12/1982 | Baohman et al. ............. 65/18.2 |
| 4,401,052 | 8/1983 | Baron et al. ................. 118/718 |
| 4,417,910 | 11/1983 | Passaret ....................... 65/18.2 |
| 4,692,180 | 9/1987 | Villain .......................... 65/157 |

FOREIGN PATENT DOCUMENTS

| 0060627 | 9/1982 | European Pat. Off. . |
| 2314152 | 12/1977 | France . |
| 322988 | 12/1929 | United Kingdom . |
| 780188 | 7/1957 | United Kingdom . |
| 1041440 | 9/1966 | United Kingdom . |
| 1389232 | 4/1975 | United Kingdom . |
| 1510127 | 5/1978 | United Kingdom . |
| 1512072 | 5/1978 | United Kingdom . |

Primary Examiner—Willard E. Hoag
Attorney, Agent, or Firm—Burns, Doane, Swecker & Mathis

[57] ABSTRACT

An apparatus for coating flat glass by directing a reactant gas over the glass surface incorporates a gas flow restrictor which comprises a chamber which is adapted to receive a supply of reactant gas and is adapted to output a flow of the reactant gas over the flat glass being coated. A series of at least two restrictions is provided in the gas flow restrictor, each restriction comprising a plate member extending across the chamber and having a plurality of apertures therethrough.

10 Claims, 1 Drawing Sheet

GLASS COATING APPARATUS

BACKGROUND OF THE INVENTION

The present invention relates to an apparatus for coating flat glass by directing a reactant gas against the glass surface, the apparatus incorporating a gas flow restrictor.

DESCRIPTION OF THE PRIOR ART

It is well known that coatings with desirable properties for architectural uses can be produced using gaseous reactants which decompose on the hot glass surface. Thus silicon coatings, useful as solar control coatings, have been produced by pyrolysing a silane-containing gas on a hot glass surface, and there have been many proposals to produce other solar control and low emissivity (high infra red reflection) coatings from other appropriate gaseous reactants. Unfortunately, it has proved difficult in commercial practice to achieve sufficiently uniform coatings of the required thickness.

UK Patent Specification No. 1507996 discloses an apparatus for coating flat glass in which a gas distributor extends across the width of the glass surface to be coated. The gas distributor includes means for releasing gas from a gas supply duct to a guide channel uniformly across the width of the channel, the channel in use extending across the width of the glass to be coated. The guide channel is shaped to cause the gas to flow substantially parallel to the glass surface to be coated under laminar flow conditions. The releasing means comprises a gas flow restrictor which is constituted by an array of channels of small cross-sectional area between the supply duct and the guide channel. The array of channels is formed by a waffle plate which comprises a plurality of crimped metal strips arranged "out-of-phase", as illustrated in FIG. 3 of the specification.

International Patent Specification No. WO 85/01522 discloses an apparatus for coating a ribbon of moving glass in which a coating gas passes through a box housing a series of alternating converging and diverging passageways. The gas exits from the box onto the glass in a uniform laminar flow of constant velocity across the width of the glass.

Whilst both of these prior proposals were stated to achieve uniform coatings on the glass substrate, nevertheless the Applicants have found that these proposals in practice encounter technical problems which can reduce the uniformity of the flow of gas over the glass and hence the uniformity of the coatings. In particular, the waffle plates of UK Patent Specification No. 1507996 are prone to blockage resulting from contaminants in the system. Also, in some applications the gaseous reactants must pass through the waffle plate at high temperatures, such as 300–400° C., and at such temperatures the metal strips are liable to distort or slip out of position. These phenomena can reduce the uniformity of the gas flow. In the apparatus of International Patent Specification No. W085/01522, a plurality of wall members define the converging and diverging passageways. These wall members each have one end which is fixed to an outer wall of the apparatus and a free end which is spaced a small distance from an opposing outer wall and defines a narrow slot therebetween. At high temperatures, the wall members can distort thereby varying the size of the narrow slot. This can affect the uniformity of the gas flow. In addition, the apparatus can be difficult to fabricate to the required standards of accuracy.

SUMMARY OF THE INVENTION

The present invention aims to overcome the disadvantages of the prior proposals described above.

Accordingly, the present invention provides an apparatus for coating flat glass by directing a reactant gas over the glass surface, the apparatus incorporating a gas flow restrictor which comprises a chamber which is adapted to receive a supply of reactant gas and is adapted to output a flow of the reactant gas over the flat glass being coated, and a series of at least two restrictions, each restriction comprising a plate member extending across the chamber and having a plurality of apertures therethrough.

The apertures of each plate member may be uniformly distributed.

Advantageously, the apertures of adjacent plate members are out of line with one another.

Preferably, the apertures in each plate member are disposed in a row.

The apertures may be circular holes. Preferably, the holes have a diameter of from 2 mm to 10 mm, especially 2mm to 5mm. For stable gas flow it is preferred that each plate member has a thickness which is at least twice the diameter of the holes in that plate member.

The shape, dimensions and relative positions of the apertures may vary for different plate members.

In one preferred arrangement, a first plate member is adjacent to an inlet for the restrictor and a second plate member is adjacent to an outlet for the restrictor. Preferably, the apertures are more closely spaced in the plate member closest to the outlet for the restrictor than in the plate member closest to the inlet for the restrictor.

The gas restrictor may further include a gas flow deflector at the outlet between the second plate member closest to the outlet and the glass. The gas flow deflector may comprise an deflector member which is disposed adjacent the apertures of the second plate member.

A third plate member may additionally be provided between the first and second plate members.

BRIEF DESCRIPTION OF THE DRAWINGS

An embodiment of the present invention will now be described by way of example only with reference to the accompanying drawings, in which.

DETAILED DESCRIPTION OF THE INVENTION

Figure 1:
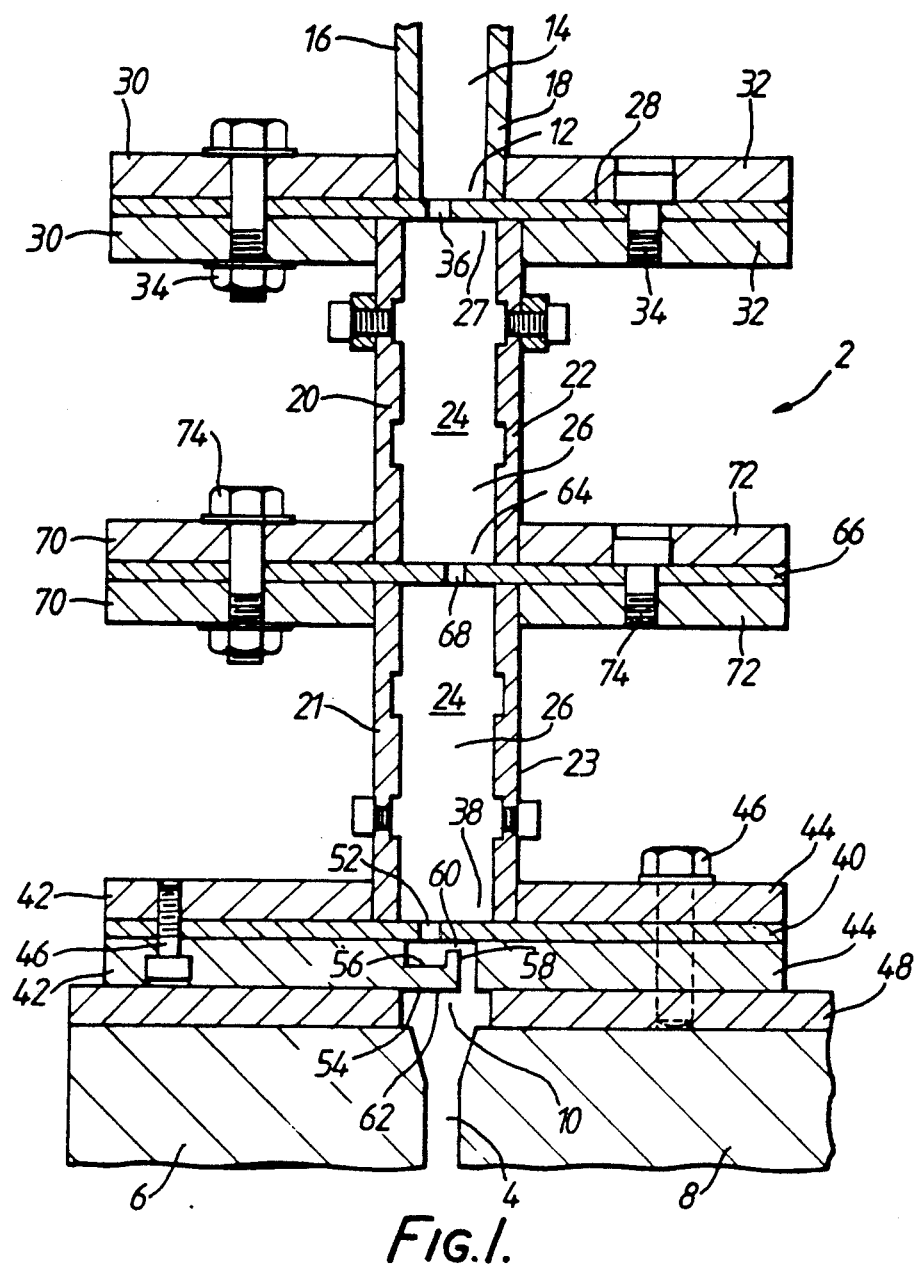
FIG. 1 is a vertical sectional view through a gas flow restrictor incorporated in an apparatus for coating flat glass in accordance with the present invention.

Referring to FIG. 1, a gas flow restrictor, designated generally as 2, is mounted over a vertical channel 4 defined between two blocks 6, 8 of graphite which are suspended across a ribbon of glass (not shown) moving from left to right. The vertical channel 4 extends transversely over the ribbon of glass being coated. The gas flow restrictor 2 constitutes part of a gas distributor which may be of a similar arrangement to that illustrated in UK Patent Specification No. 1507996, the disclosure of which is incorporated herein by reference. An outlet 10 of the gas flow restrictor 2 is aligned with the vertical channel 4. An inlet 12 of the gas flow restrictor 2 is, in the illustrated embodiment, connected to a fantail distributor 14. The fantail distributor 14 has a front (or upstream with reference to the direction of glass movement) wall 16 and a back (or downstream, with reference to the direction of glass movement) wall 18, each being in the shape of an inverted fan. The front and back walls 16, 18 converge towards one another as the width of the fantail increases in a downwards direction.

The gas flow restrictor 2 comprises pairs of opposed elongate walls 20, 22 and 21, 23 which define an elongate chamber 24. The elongate walls 20, 22 and 21, 23 extend transversely across the ribbon of glass being coated, walls 20 and 21 being upstream walls and walls 21 and 23 being downstream walls. Opposed end walls 26 are provided at each end of the elongate chamber 24, each end wall 26 being disposed parallel with the direction of movement of the ribbon of glass.

At the inlet 12 of the gas flow restrictor 2, is disposed an inlet restriction 27 comprising an inlet elongate plate member 28 which extends across the chamber 24. The inlet plate member 28 is sealingly fixed between opposing pairs of horizontal plates 30, 32, each pair of plates 30, 32 being attached e.g. by welding, to a respective elongate wall 20, 22 and to the fantail distributor 14. The plates of each pair 30, 32 are tightly connected together by threaded connectors 34. Gaskets (not shown) are disposed between each pair of plates 30, 32 and the inlet plate member 28.

Figure 2:
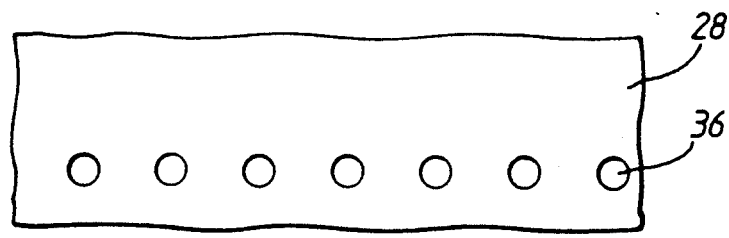
FIG. 2 is a plan view of part of an elongate plate member of the gas flow restrictor of FIG. 1.

FIG. 2 shows the inlet plate member 28 in greater detail. A row of apertures 36 which extends along the length of the inlet plate member 28 is provided through the plate member 28, the apertures 36 connecting the inlet 12 with the remainder of the chamber 24. The apertures 36 are circular holes. The holes preferably have a diameter of from 2 mm to 10 mm. In one particularly preferred embodiment, the holes 36 have a diameter of 4 mm and have centers spaced 20 mm apart. The row of holes 36 is disposed on an upstream side of the elongate chamber 24 i.e. the row of holes 36 is nearer to the upstream wall 20 than to the downstream wall 22 of the chamber 24.

Adjacent the outlet 10 of the gas flow restrictor 2 is disposed an outlet restriction 38. The outlet restriction 38 is of substantially the same construction as the inlet restriction 27 in that it comprises an outlet elongate plate member 40 which is sealingly fixed between two opposing pairs of plates 42, 44, the upper plate of each of said pairs of plates 42, 44 being connected e.g. by welding to a respective elongate wall 21, 23. The plates 42, 44 are separated from the outlet plate member 40 by gaskets (not shown). The plates 42, 44 are tightly connected together by threaded connectors 46 which also firmly attach the plates 42, 44, and thereby the gas flow restrictor 2, to a plate 48 which is fixed to the tops of the graphite blocks 6, 8. The outlet plate member 40 is provided with a row of holes 52 having a diameter of 4mm and centres spaced 10mm apart, the row of holes 52 being disposed on the upstream side of the elongate chamber 24.

A gas flow deflector 54 is mounted at the outlet 10 of the gas flow restrictor 2 below the outlet plate member 40. The gas flow deflector 54 comprises an elongate L-shaped member 56 which is integral with the lower of said pair of plates 42 and is disposed adjacent the holes 52. The free arm 58 of the L-shaped member 56 extends upwardly towards the outlet plate member 40 to define therebetween a gap 60 through which reactant gas from the holes 52 must pass after having been deflected by the horizontal arm 62 of the L-shaped member 56.

The purpose of the gas flow deflector 54 is to remove certain localised increases in gas flow which may occur. Thus there is a tendency for the gas flow to be more intense in the immediate vicinity of each of the holes 52 in the outlet plate member 40 on the downstream side of the plate member 40. The presence of the gas flow deflector 54 evens out these localised increased intensities of flow. In some instances it may be possible to omit the gas flow deflector 54 from the gas flow restrictor of the invention.

An intermediate restriction 64 is disposed between the inlet and outlet restrictions 27, 38. The intermediate restriction 64 has the same construction as the inlet restriction 27 and comprises an intermediate elongate plate member 66 with a row of holes 68. The intermediate plate member 66 is sealingly fixed between opposing pairs of horizontal plates 70, 72 which are attached e.g. by welding to the elongate walls 20, 21 and 22, 23 respectively. Gaskets (not shown) are disposed between the plates 70, 72 and the intermediate plate member 66 and the flanges 70, 72 are tightly connected together by threaded connectors 74. The row of holes 68 of the intermediate plate member 66 is, in contrast to the inlet and outlet plate members 28, 40, disposed on a downstream side of the elongate chamber 24 i.e. the row of holes 68 is nearer to the downstream walls 22, 23 than to the upstream walls 20, 21 of the chamber 24. This arrangement results in the row of holes of adjacent elongate plate members being out of line with each other. In a preferred embodiment, where the holes in the plate members have a diameter of 4mm, the plate members each have thickness of 10mm.

The operation of the gas flow restrictor 2 will now be described.

The gas flow restrictor 2 forms part of a coating apparatus which is suspended across an advancing ribbon of glass. The coating apparatus may have one or more of the vertical channels 4 and a corresponding number of gas flow restrictors 2 depending on whether one or more reactant gases are to be introduced separately into a coating chamber over the ribbon of glass. The or each vertical channel exits above the ribbon of glass and when there is more than one vertical channel, the channels are located in series in a direction along the direction of movement of the ribbon of glass. An exhaust duct is provided downstream of the vertical channel(s).

When the ribbon of glass is float glass, the width of the ribbon of glass may be about 3 meters. Each vertical channel and each gas flow restrictor must be the same length as the width of the glass to be coated so that reactant gas is directed uniformly over the glass surface. Accordingly, the gas flow restrictor may be about 3 meters long and it is this length requirement which has led to the problems in the prior art referred to above concerning the attainment of a uniform gas flow over the entire width of the glass to be coated.

With the present invention, these problems are overcome by tightly clamping each restriction and providing in each restriction apertures whose distribution and size can be accurately controlled and are not subject to significant variations as a result of differential thermal expansion in different parts of the gas distributor.

A reactant gas, diluted in a carrier gas, is fed to the inlet 12 of the gas flow restrictor 2 through the fantail distributor 14. The gas impinges on the inlet restriction 27 and is forced through the apertures 36 at high velocity. The pressure drop across the apertures 36 through the inlet plate member 28 is greater than that along the inlet 12. The restriction 27 accordingly tends to cause the gas to be evenly distributed along the length of the chamber 24. The flow is then forced through the apertures 68 in the intermediate plate member 66 of the intermediate restriction 64. The apertures 68 are not in line with the apertures 36 of the inlet restriction 27. Accordingly, this prevents a "jetting" effect, i.e. a jet of gas cannot pass through one aperture 36 in the inlet restriction 27 and then directly through a corresponding aperture 68 in the intermediate restriction 64 without being deflected. Again, the gas is forced through the apertures 68 at high velocity and a pressure build up on the inlet side of the intermediate restriction 64 causes further equalisation of gas flow along the length of the intermediate restriction 64. In a similar manner the gas issuing from the apertures 68 is then forced through the apertures 52 in the outlet restriction 34. Since the apertures 68, 52 in the intermediate and outer restrictions are out of alignment, the jetting effect referred to above is prevented. The gas issues from the apertures 52 in the outlet restriction 38 as a gas flow which is substantially uniform across the length of the gas flow restrictor 2 i.e. across the width of the ribbon of glass. The gas is deflected by the gas flow deflector 54 and is forced through the gap 60. The gas flow deflector 54 prevents jets of gas from the apertures 52 impinging directly on the ribbon of glass which could cause localised regions of increased coating thickness and could result in a streaking effect on the coating. A uniform gas flow issues from the gap 60 and is directed downwardly along the channel 4 towards the ribbon of glass.

The advantages of the gas flow restrictor described are that each restriction is substantially unaffected by the high temperatures of around 300°-400° C. which are typically encountered. Because for each aperture in the restriction, the whole circumference of each aperture is defined by a single plate, the size of each aperture (and hence the distribution of the gas flow) is not affected by differences in the thermal expansion of two separate members. This is in contrast to the situation in which the gas flows through a slot defined between the edges of two separate members, when differences in thermal expansion between the two members are liable to lead to irregularities in the width of the slot. It is difficult enough to produce narrow slots of regular width over a distance of about 3 meters; when such narrow slots are subjected to the high temperatures encountered when coating a hot ribbon of float glass there is a risk that the slots will distort and lead to non-uniform flows of gas. The present arrangement, which relies on a series of holes in a plate member, is not susceptible to the same problems of distortion. Although the dimensions of the holes will be affected by temperature, the holes will all tend to expand to the same extent and provide more uniform gas flow across the width of the gas restrictor.

As indicated above, although the gas flow restrictor can be 3 meters wide, the distortion problems of the prior art systems are overcome or at least alleviated by the present invention. Also, each plate member is relatively easy to manufacture by drilling and reaming a row of holes in the plate member. Each restriction is fully sealed by the adjacent plate and this ensures that the gas is constrained to flow only through the apertures which are of predetermined dimensions and spacing. This enables proper control over the uniformity of flow of gas across the ribbon of glass to be maintained.

The number of restrictions in the gas flow restrictor may be varied as desired depending upon the particular coating application. Thus for example, in some applications, the intermediate restriction 6 may be omitted; in this case, it is desirable to have the row of holes 68 on the downstream side of the elongate chamber 24 to prevent "jetting" through aligned holes in the row of holes 36 and the row of holes 52.

Furthermore, the size, spacing and positions of the holes in the restrictions can be varied. In addition, the shape, dimensions and relative positions of the holes may vary for different plate members.

What we claim is:

1. Apparatus for coating flat glass by directing a reactant gas over the glass surface, the apparatus incorporating a gas flow restrictor having an inlet and an outlet, which gas flow restrictor comprises a chamber which is adapted to receive a supply of reactant gas and is adapted to output a flow of the reactant gas over the flat glass being coated, a series of at least two restrictions, each restriction comprising a plate member extending across the chamber and having a plurality of apertures therethrough, and a gas flow deflector at the outlet of the restrictor for deflecting the gas flow from the outlet and preventing the gas flow from impinging directly on the glass.

2. Apparatus according to claim 1 wherein the apertures of each plate member are uniformly distributed.

3. Apparatus according to claim 1 wherein the apertures of adjacent plate members are out of line with one another.

4. Apparatus according to claim 1 wherein the apertures in each plate member are disposed in a row.

5. Apparatus according to claim 1 wherein the apertures are circular holes.

6. Apparatus according to claim 5 wherein the holes have a diameter of from 2 mm to 10 mm.

7. Apparatus according to claim 1 wherein the shape, dimensions and relative positions of the apertures vary for different plate members.

8. Apparatus according to claim 1 wherein a first plate member is adjacent to the inlet for the restrictor and a second plate member is adjacent to the outlet for the restrictor.

9. Apparatus according to claim 1 in which the apertures are more closely spaced in the plate member closest to the outlet for the restrictor than in the plate member closest to the inlet for the restrictor.

10. Apparatus according to claim 8 wherein the gas flow deflector comprises a deflector member which is disposed adjacent the apertures of the second plate member.

* * * * *